United States Patent
Nakagawa

(10) Patent No.: US 6,614,071 B1
(45) Date of Patent: Sep. 2, 2003

(54) NON-VOLATILE SEMICONDUCTOR MEMORY DEVICE

(75) Inventor: Ken-Ichiro Nakagawa, Tokyo (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 09/270,331

(22) Filed: Mar. 16, 1999

(30) Foreign Application Priority Data

Mar. 16, 1998 (JP) .......................................... 10-065922

(51) Int. Cl.⁷ ............................................ H01L 29/788
(52) U.S. Cl. ........................ 257/317; 257/321; 257/401; 257/900; 365/185.1
(58) Field of Search ................................ 257/314, 315, 257/321, 317, 401, 900; 438/257, 260, 263, 264; 365/185.05, 185.1, 185.26

(56) References Cited

U.S. PATENT DOCUMENTS

| | | | | |
|---|---|---|---|---|
| 4,868,617 A | * | 9/1989 | Chiao et al. | 257/344 |
| 5,863,822 A | * | 1/1999 | Kanamori et al. | 438/264 |
| 5,915,177 A | * | 6/1999 | Tseng | 438/264 |
| 5,946,240 A | * | 8/1999 | Hisamune | 365/185.28 |
| 5,981,993 A | * | 11/1999 | Cho | 257/311 |
| 6,187,636 B1 | * | 2/2001 | Jeong | 438/267 |

FOREIGN PATENT DOCUMENTS

| | | |
|---|---|---|
| JP | 5-90610 | 4/1993 |
| JP | 7-153857 | 6/1995 |
| JP | 8-23081 | 1/1996 |
| JP | 9-312351 | 12/1997 |

* cited by examiner

Primary Examiner—George Eckert
(74) Attorney, Agent, or Firm—Scully, Scott, Murphy & Presser

(57) ABSTRACT

A semiconductor memory device of the present invention comprises, a semiconductor substrate, a drain region formed in the semiconductor substrate, a source region formed in the semiconductor substrate, a gate insulating film formed between the drain region and the source region on the semiconductor substrate, a floating gate electrode formed on the gate insulating film. The floating gate electrode has a projection portion on the end portion thereof.

15 Claims, 7 Drawing Sheets

US 6,614,071 B1

NON-VOLATILE SEMICONDUCTOR MEMORY DEVICE

BACKGROUND OF THE INVENTION

1. Field of the Invention

The present invention relates to a non-volatile semiconductor memory device, more particularly to a non-volatile semiconductor memory device that can speed up both writing and erasing performances without increasing its memory cell area and be manufactured at a low cost.

2. Description of the Related Art

Improvement of both writing and erasing performances has been major demands for non-volatile semiconductor memories. In order to satisfy such demands, several types of such semiconductor memories are proposed, for example, by Japanese Laid-Open Patent Application No. 7-153857, No. 5-90610, and No. 9-312351.

FIGS. 3A through 3J illustrate a conventional non-volatile semiconductor memory device disclosed in Japanese Laid-Open Patent Application No. 7-153857.

As illustrated in FIG. 3A, a field insulating film 102 is formed selectively on the surface of a p-type silicon substrate 101 so as to partition an element area. Then, an insulating film (not illustrated), a polysilicon film (not illustrated), an oxide film (not illustrated), and a nitride film (not illustrated) are formed on the element area. After this, those films are patterned to form a gate insulating film 110, a gate polysilicon film 111, and a laminated film 112 consisting of the oxide and nitride films sequentially and selectively. An oxide film 113 and a nitride film 114 are formed sequentially on the entire surface as illustrated in FIG. 3B. Then, as illustrated in FIG. 3C, the nitride film 114 is etched back to form an insulating film 115 consisting of a nitride film on the side walls of the gate polysilicon film 111 and the laminated film 112. After this, n-type impurities are ion-implanted on the surface of the element area using both side wall insulating film 115 and field insulating film 102 as masks, then the n-type impurities are thermodiffused thereby to form an n-type source-drain area 103.

As illustrated in FIG. 3D, the surface of the element area is oxidized by heat using both side wall insulating film 115 and field insulating film 102 as masks, thereby an oxide film 104 is formed on the surface of the source-drain area 103. After this, the nitride film in the laminated film 112 and the side wall insulating film 115 remaining on the top and side wall surfaces of the gate polysilicon film 111 as illustrated in FIG. 3E are removed by wet etching. The oxide film 113 is also removed by wet etching at this time. And, as illustrated in FIG. 3F, an oxide film 107 is formed on the top and side surfaces of the gate polysilicon film 111, as well as on the surface of the exposed element area. The oxide film 107 is formed thinner than the gate insulating film 110.

After this, as illustrated in FIG. 3G, a polysilicon layer 116 is formed on the entire surface. Then, as illustrated in FIG. 3H, the polysilicon layer 116 is etched back thereby to form a side wall film 117 consisting of polysilicon on the side wall of the gate polysilicon film 111 and over the top surface of the source-drain area 103 that is not covered by any of the gate polysilicon film 111 and the oxide film 104. The oxide film 107 on the surface of the gate polysilicon film 111 is removed by wet etching. Then, as illustrated in FIG. 3I, a polysilicon film is formed on the entire surface and the film is patterned thereby to form a floating gate 105 consisting of this polysilicon layer, the gate polysilicon film 111, and the side wall film 117. After this, an interlaminar insulating film 109 is formed on the entire surface, and a control gate 106 consisting of polysilicon is formed on the entire surface, as illustrated in FIG. 3J.

In each memory cell of such a conventional non-volatile semiconductor memory formed as described above, the oxide film 107 being in contact with the source-drain area 103 is formed thinner than the gate insulating film 110 formed under the gate polysilicon film 111 and the floating gate 105 is extended onto the oxide film 104 formed over the source-drain area 103. Consequently, it is possible to increase the capacity ratio between the control gate 106—floating gate 105 capacity and the floating gate 105—substrate 101 capacity. And therefore, both writing and erasing performances of the non-volatile semiconductor memory are speeded up.

In the conventional non-volatile semiconductor memory, however, the floating gate 105 is extended onto the oxide film 104 thereby to increase the capacity ratio as described above. The source-drain area 103 must thus be designed to be longer in width than the channel, for example, to form a cotact hole. Consequently, the memory cell size exceeds the minimum design value.

In addition, according to the conventional non-volatile semiconductor memory manufacturing method, the lithographic process is needed twice, that is, the first process needed in the process for forming the gate insulating film 110, the gate polysilicon film 111, and the laminated film 112 illustrated in FIG. 3B selectively and the second process needed in the process for forming the floating gate 105 illustrated in FIG. 3I before the floating gate 105 is formed. And, the minimum design sizes must be used in each of those lithographic processes. Increasing the number of lithographic processes such way will also increase the number of manufacturing processes and result in an increase in the cost of forming masks. The minimum design sizes must also be used for forming those masks. A high performance lithographic apparatus is thus required to form those masks at the minimum design sizes, which will further increase the facility cost.

SUMMARY OF THE INVENTION

It is an object of the present invention to provide a non-volatile semiconductor memory device that can speed up both writing and erasing performances without increasing the memory cell area and can be manufactured at a low cost.

A semiconductor memory device of the present invention comprises, a semiconductor substrate, a first diffusion region formed in the semiconductor substrate, a second diffusion region formed in the semiconductor substrate, the second diffusion region apart from the first diffusion region, an insulating film formed between the first diffusion region and the second diffusion region on the semiconductor substrate; and a gate film formed on the insulating film, the gate film having a projection portion on the end portion thereof.

A semiconductor memory device of the other present invention comprises, a semiconductor substrate; a first diffusion region and a second diffusion region formed selectively on the semiconductor substrate, a first insulating film formed between the first diffusion region and the second diffusion region on the semiconductor substrate, a second insulating film formed between the first insulating film and the first diffusion region on the semiconductor substrate, a third insulating film formed between the first insulating film and the second diffusion region on the semiconductor substrate, the first insulating film having a thickness which is thicker than the thickness of each of the second and third insulating film; and a gate film formed on the first insulating film, the gate film have a projection portion protruded from the end portion thereof.

A method for manufacturing a semiconductor memory device of the present invention comprises:
  forming a first insulating film selectively on a substrate;
  forming a first conductor film on the first insulating film;
  forming a second insulating film on the first conductor film;
  forming a third insulating film on the second insulating film;
  forming a fourth insulating film on a surface of the substrate and on a side surface of the first conductor;
  forming a second conductor film on the fourth insulating film so that the fourth insulating film is sandwiched between the first conductor film and the second conductor film, and on a side surface of the second insulating film;
  removing the second and the third insulating films to expose the first conductor film; and
  forming a third conductor film on the side surface of the second conductor film to be in contact with the first conductor film.

BRIEF DESCRIPTION OF THE DRAWINGS

The above and other objects, advantages and features of the present invention will be apparent from the following description taken in conjunction with the accompanying drawings, in which.

PREFERRED EMBODIMENTS OF THE INVENTION

FIGS. 1A through 1I are cross sectional views of the non-volatile semiconductor memory device according to the first embodiment of the present invention.

Figure 1A:
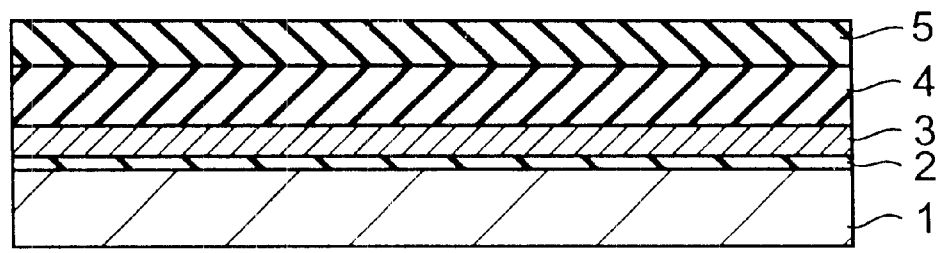
FIGS. 1A to 1I are cross sectional views indicating the respective process for manufacturing a non-volatile semiconductor memory device according to the first embodiment of the present invention.

As illustrated in FIG. 1A, an oxide film 2 is formed on a semiconductor substrate 1 with a thickness of 120 to 200 Å, then a polysilicon film 3 is formed on this oxide film 2 with a thickness of 1000 to 2000 Å. After this, on the polysilicon film 3 is formed an oxide film 4 with a thickness of 1000 to 2000 Å and a nitride film 5 with a thickness of about 1500 Å sequentially.

Figure 1B:
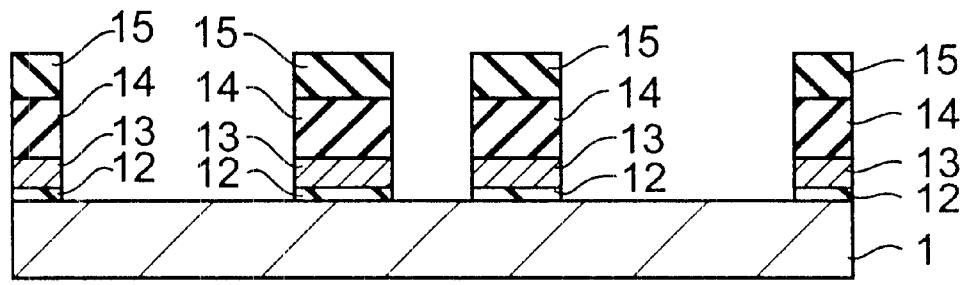

Then, as illustrated in FIG. 1B, a predetermined-shape resist mask (not illustrated) is formed on the nitride film 5. This mask is used to pattern the nitride film 5, the oxide film 4, and the polysilicon film 3. After this, the resist mask is removed. The oxide film 2 exposed due to the patterning of the polysilicon film 3 is then removed by wet etching. Consequently, in a predetermined area of the semiconductor substrate 1 are formed a gate oxide film 12, a gate polysilicon film (a first conductive film) 13, a first oxide film 14, and a nitride film 15.

Figure 1C:
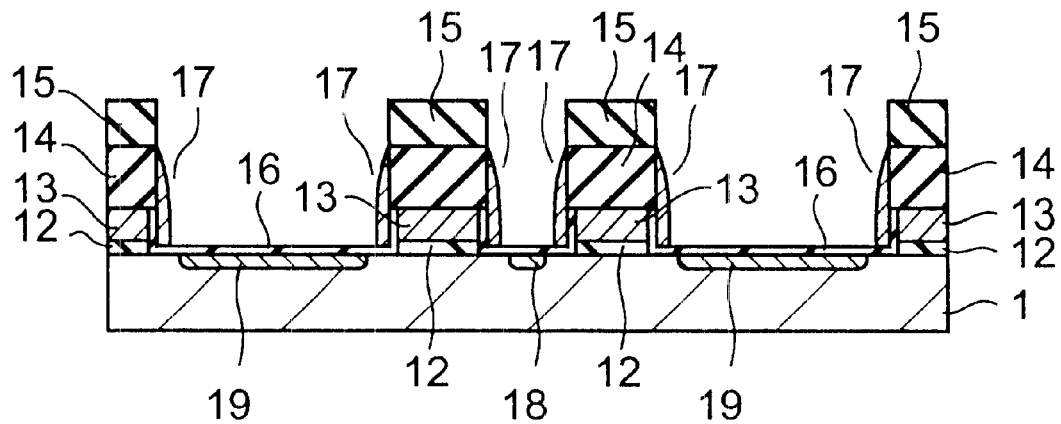

As illustrated in FIG. 1C, the entire surface is oxidized thereby to form a second oxide film 16 with a thickness of 80 to 110 Å on the surface of the exposed semiconductor substrate 1 and on the side wall of the gate polysilicon film 13 respectively. Then, a polysilicon film (not illustrated) is formed on the entire surface and this polysilicon film is etched back thereby to form a side wall film (a second conductive film) 17 with a thickness of 0.05 μm or less on the side walls of the gate silicon film 13 and the first oxide film 14. At this time, the etching condition should be selected carefully to avoid forming of the side wall film 17 on the side wall of the nitride film 15. After this, arsenic ion, phosphorus ion, or the like is implanted on the surface of the substrate 1 that is not covered by the gate polysilicon film 13, the side wall film 17, etc. thereby to form a source diffusion layer 18 and a drain diffusion layer 19 on the surface of the substrate 1 respectively. It is possible to use such process that, before the side wall 17 is formed, the source area is covered with a resist film, the arsenic ion, phosphorus ion, or the like is then implanted in the drain area to form the drain diffusion layer 19, the resist film covering the source area is then removed and the source diffusion layer 18 is then formed by implanting ion in the source area.

Figure 1D:
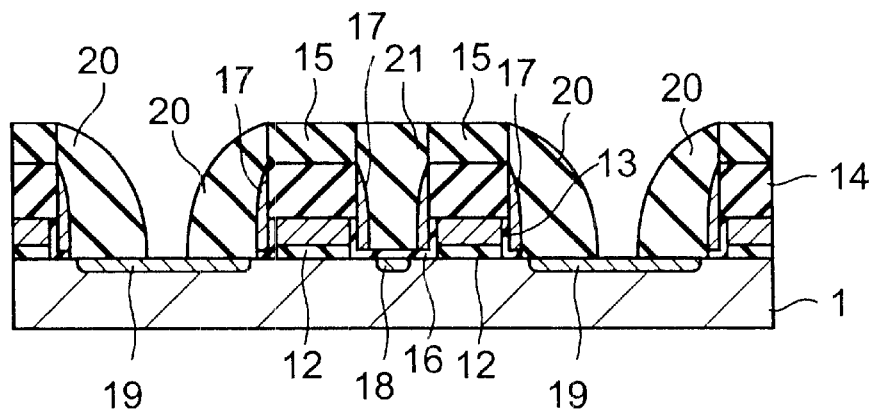

As illustrated in FIG. 1D, an oxide film (not illustrated) is formed on the entire surface and this oxide film is etched back thereby to form a side wall insulating film 20 on the side walls of the gate polysilicon film 13 and the first oxide film 14, at the drain diffusion layer side. In addition, an embedded insulating film 21, formed by, for example, an oxide film is formed on the source diffusion layer 18 formed between the adjacent gate polysilicon film 13, the first oxide film 14 and the nitride film 15. In order to cover the source diffusion layer 18 completely with the embedded insulating film 21, the embedded insulating film 21 is formed by an oxide film having a high embedding-characterization, for example, a high density plasma oxide film. It is preferable to form an oxide film having good film quality, for example, a high temperature CVD (chemical vapor deposition) oxide film on the side wall film 17 before the side wall insulating film 20 and the embedded insulating film 21 are formed.

Figure 1E:
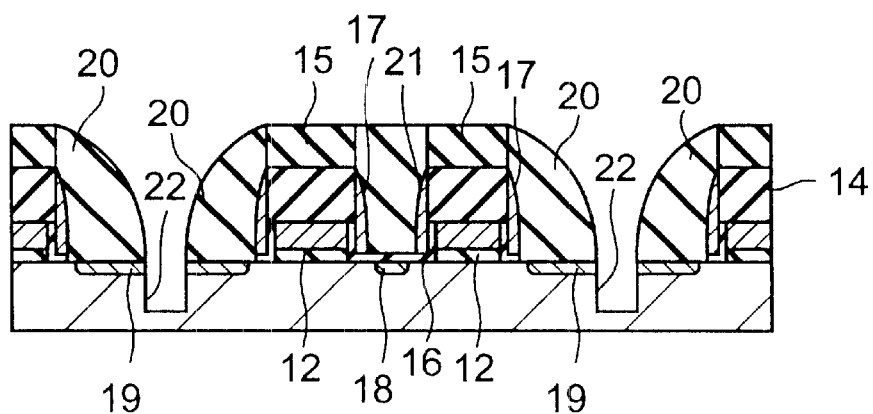
Figure 1F:
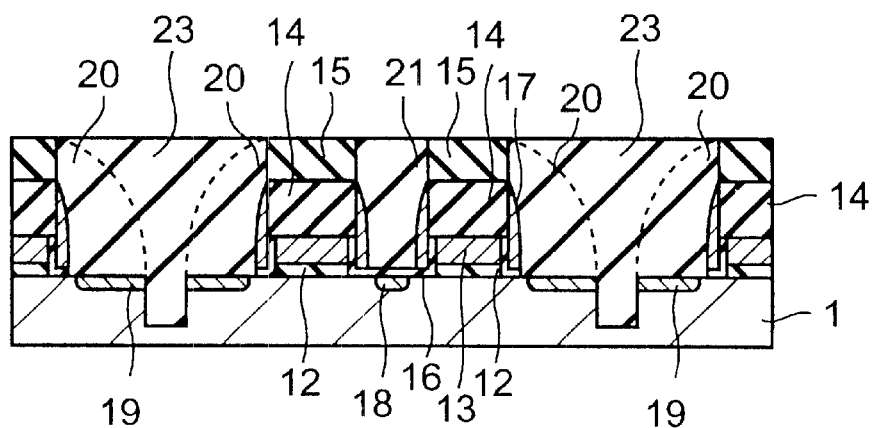

After this, as illustrated in FIG. 1E, the surface of the substrate 1 is etched using the side wall film 20 as a mask thereby to form an element isolating recess 22 in the surface of the drain diffusion layer 19. Then, as illustrated in FIG. 1F, an oxide film 23 is formed on the entire surface so as to fill up the space between the element isolating recess 22 and the adjacent side wall insulating film 20. The surface of this oxide film 23 is polished by CMP (chemical machine polishing) thereby to expose the surface of the nitride film 15.

Figure 1G:
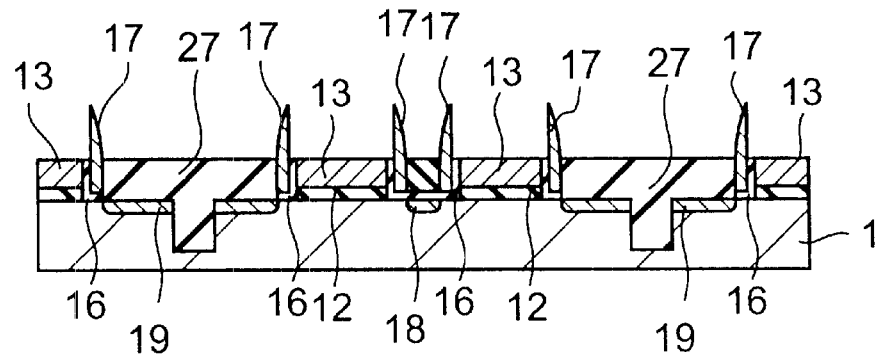
Figure 1H:
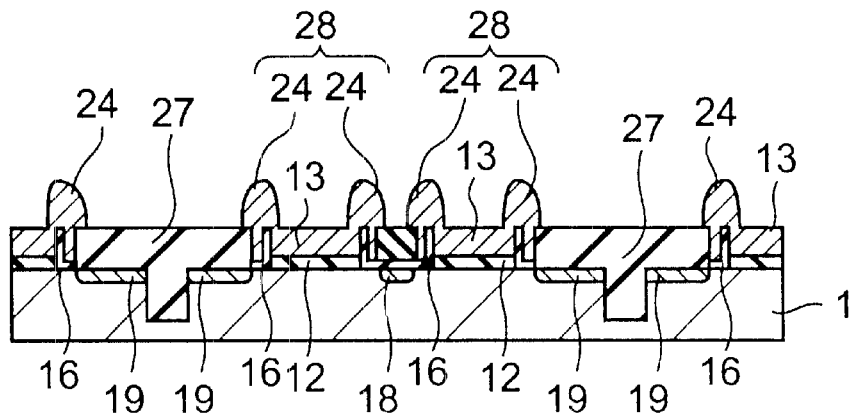
Figure 1I:
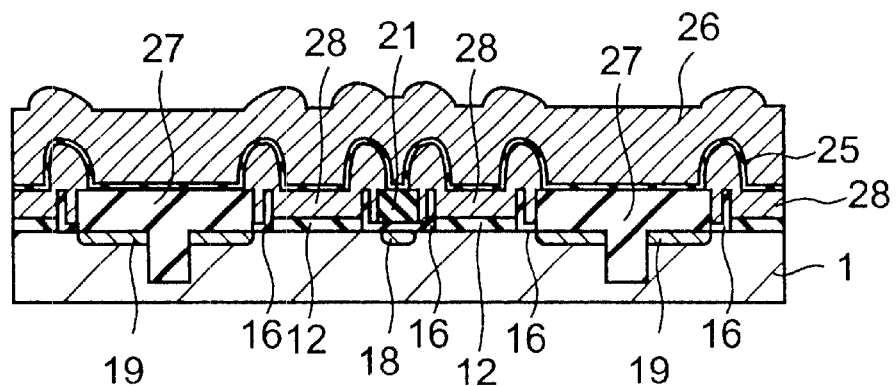

Then, as illustrated in FIG. 1F and FIG. 1G, the nitride film 15 is removed by wet etching. Then, the first oxide film 14, the upper surfaces of the oxide film 23, the side wall insulating film 20, and the embedded insulating film 21 are etched respectively to form an element isolating film to partition the element area. Therefore, the side wall film 17 is protruded from the surface. After this, a polysilicon film (not illustrated) is formed on the entire surface. This polysilicon film is then etched back, thereby the polysilicon film (the third conductor film) remains only on the side wall 17 protruded from the surface thereby to form a projection 24. Consequently, the gate polysilicon film 13 is connected to the side wall film 17 electrically, thereby a floating gate 28 having the gate polysilicon film 13 and the projection 24 is formed in each memory cell.

After this, an interlaminar insulating film 25 is formed on the entire surface with a thickness of 120 to 200 Å (converted to an oxide film thickness). The film 25 includes an $SiO_2$ film, a $Si_3N_2$ film, and an $SiO_2$ film. Then, a control gate 26 formed by, for example, polysilicon is formed in each memory cell with a thickness of 1000 to 2000 Å, and this control gate 26, the interlaminar insulating film 25, and the floating gate 28 are etched into predetermined shapes. Then, an interlaminar film, a wiring, etc. are formed in well-known processes thereby to obtain the memory cells of the above-mentioned non-volatile semiconductor memory.

When data is written in a memory cell of such a non-volatile semiconductor memory composed as described above, for example, −9V voltage is applied to the control gate 26 and, for example, 4V voltage is applied to the drain diffusion layer 19. Consequently, an FN tunnel current is generated and electrons are moved from the floating gate 28 to the drain diffusion layer 19. On the other hand, when data is erased from the memory cell of the non-volatile semiconductor memory, the drain diffusion layer 19 and a well area formed under the gate oxide film 12 are grounded thereby to generate the FN tunnel current. Consequently electrons are moved from the drain diffusion layer 19 to the floating gate 28. At this time, the source diffusion layer 18 and the well area may be grounded thereby to move electrons from the source diffusion layer 18 to the floating gate 28 or all of the source diffusion layer 18, the drain diffusion layer 19, and the well area may be grounded thereby to move electrons from the source diffusion layer 18 and the drain diffusion layer 19 to the floating gate 28.

When data is written in the memory cell of the non-volatile semiconductor memory, drain disturbing, gate disturbing, etc. will occur in non-selected memory cells. However, such gate disturbing time can be reduced by writing data in a plurality of memory cells simultaneously. Consequently, the writing performance can be speeded up. On the other hand, the above-mentioned drain disturbing time can also be reduced by forming a selective transistor for each memory cell group comprising a plurality of memory cells and dividing bit lines into a main bit line and sub-bit lines and selecting those main and sub-bit lines together when in a writing operation.

When data is read from the memory cell of non-volatile semiconductor memory, for example, 3V voltage is applied to the control gate 26 and 1V voltage is applied to the drain diffusion layer 19. Then, it is judged whether data is 0 or 1 by measuring if a current flows in the channel area.

In this embodiment, the floating gate 28 has a projection 24 at its end surface, thereby the area where the control gate 26 and the floating gate 28 face each other is increased. In addition, since the capacity between a channel and the floating gate 28 is small, the capacity between the drain diffusion layer 19 and the source diffusion layer 18 or the floating gate 28 is increased. Consequently, the non-volatile semiconductor memory of the present invention can speed up both writing and erasing performances more than the conventional non-volatile semiconductor memory even when an equal voltage is applied to both of the drain diffusion layer 19 and the control gate 26.

In each memory cell of the conventional non-volatile semiconductor memory, the floating gate is extended onto the source-drain area thereby to increase the capacity ratio. Thus, the memory cell area cannot be reduced. In this embodiment, however, it is possible to minimize each of the gate width, the channel length, the source width, the drain width, and the element isolating film width. The memory cell area can thus be reduced more significantly than the conventional memory cell area.

In addition, according to the conventional non-volatile semiconductor memory manufacturing method, the lithographic process is needed twice for forming floating gates in memory cells and the lithographic process requires strict positioning of the memory cell parts. Thus, the manufacturing and facility costs are unavoidably increased. In this embodiment, however, the lithographic process is needed only once for forming such the floating gates. Consequently, the manufacturing and facility costs can be reduced significantly.

In addition, although it is expected that the channel length in the area where the gate oxide film 12 is formed is 0.2 $\mu$m or under and the width of the remaining second oxide film 16 is 0.05 $\mu$m or under at one side in this embodiment, the present invention can also cope with larger sizes. Although the projection 24 is 1000 to 2000 Å in height in this embodiment, the height should preferably be 2000 Å or over so as to speed up the writing performance effectively when the channel is long.

In addition, the gate oxide film 12 should be formed as thickly as possible. Because, the writing performance cannot be speeded up effectively if there is not so much difference between the gate oxide film 12 and the second oxide film 16 in thickness. The lower limit of the second oxide film 16 in thickness is decided by the capacity of the floating gate 28 for holding an electric charge. The upper limit of the gate oxide film 12 in thickness is decided by the memory-cell-on current. Consequently, the second oxide film 16 should preferably be 120 to 200 Å in thickness when the capacity of the floating gate for holding an electric charge and the memory cell on current are considered.

In this embodiment, the control gate 26 is formed with a polysilicon film which is 1000 to 2000 Å in thickness. However, the present invention also allows WSi, and the like to be sputtered on this polysilicon film so that the resistance of the control gate 26 can be lowered. And, although two memory cells share one source diffusion layer 18 in this embodiment, the present invention also allows such the structure to be varied freely.

Figure 2:
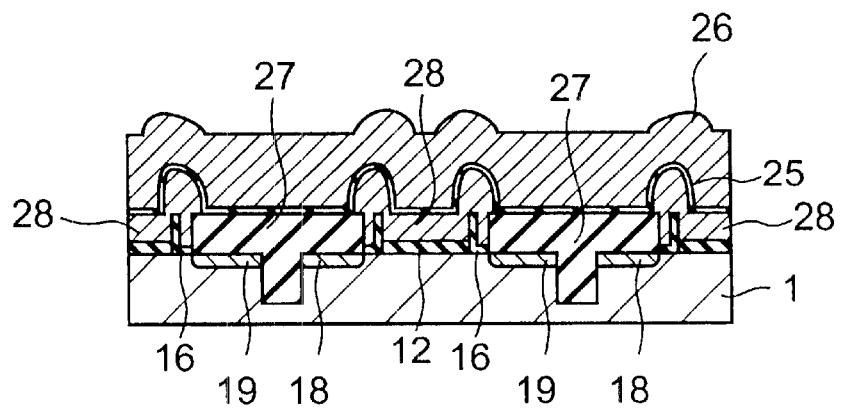
FIG. 2 is a cross sectional view indicating the non-volatile semiconductor memory device according to the second embodiment of the present invention.
Figure 3A:
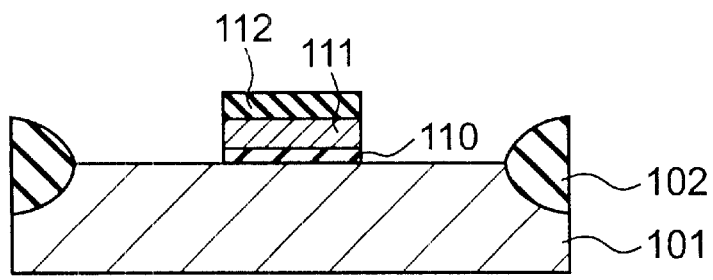
FIGS. 3A to 3J are is cross sectional views indicating the respective process for manufacturing a conventional non-volatile semiconductor memory device.
Figure 3B:
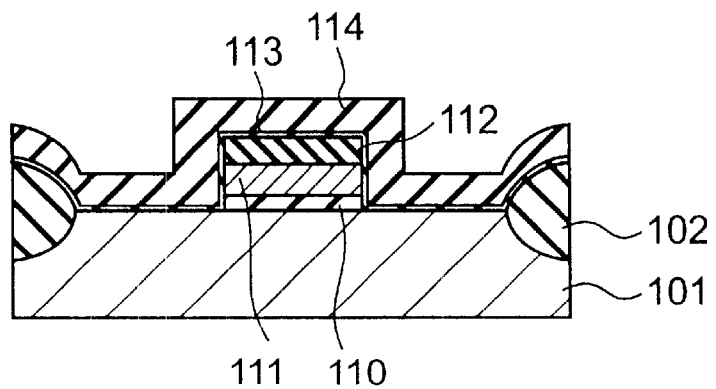
Figure 3C:
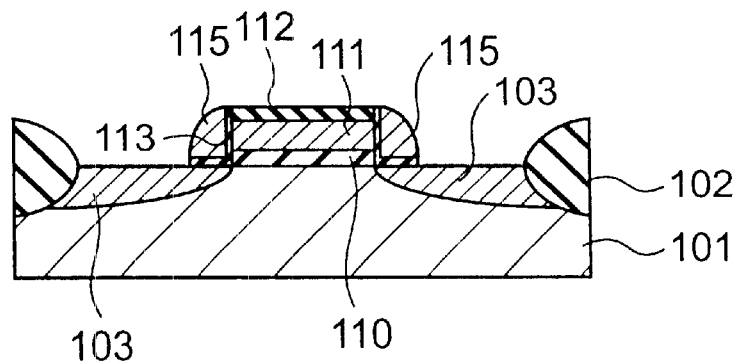
Figure 3D:
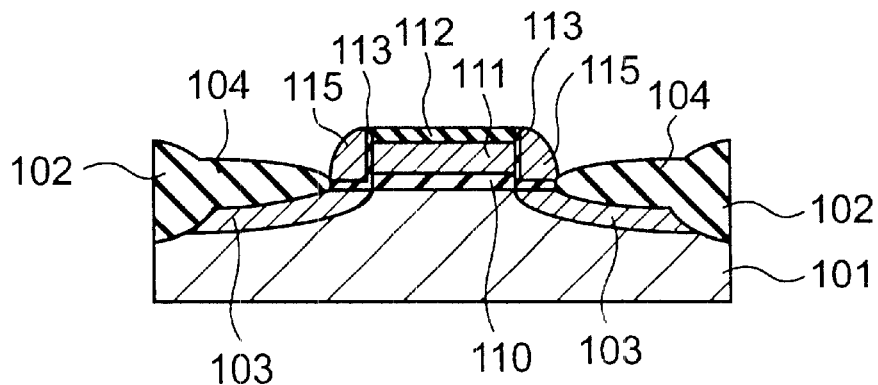
Figure 3E:
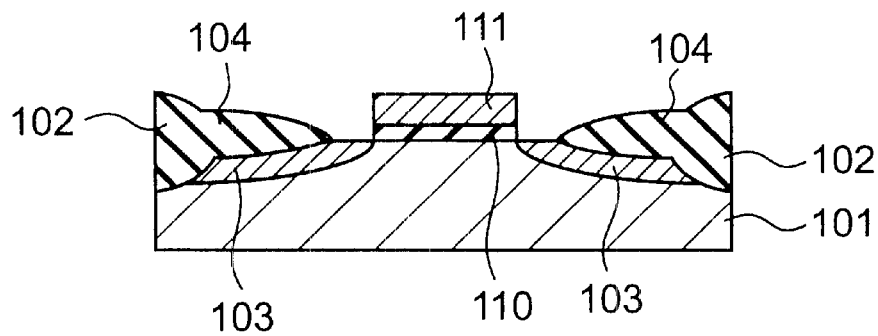
Figure 3F:
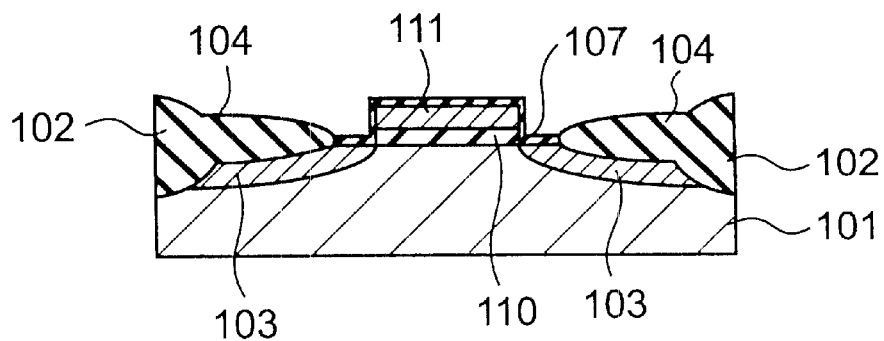
Figure 3G:
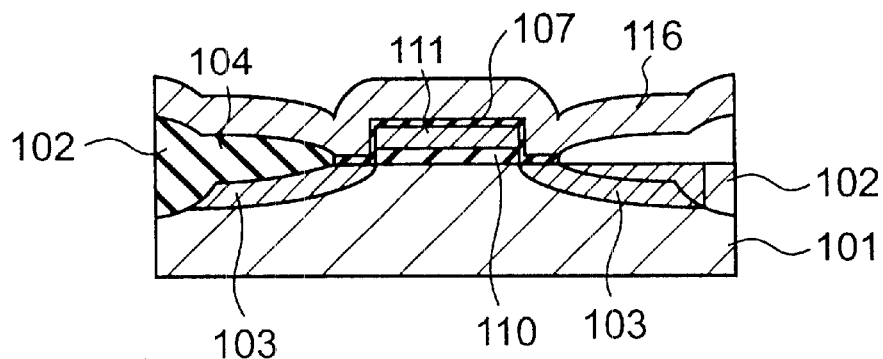
Figure 3H:
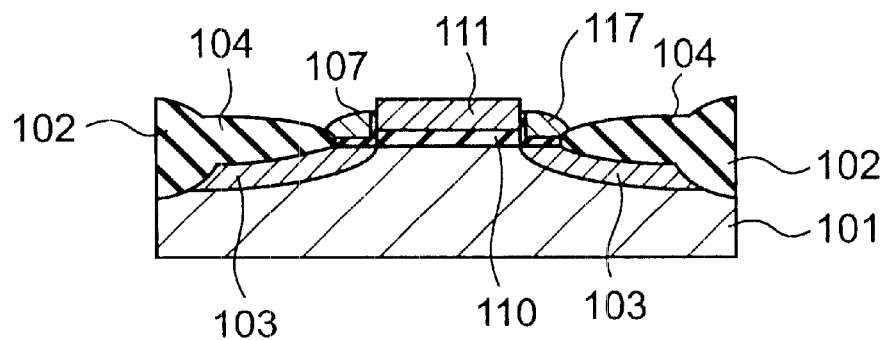
Figure 3I:
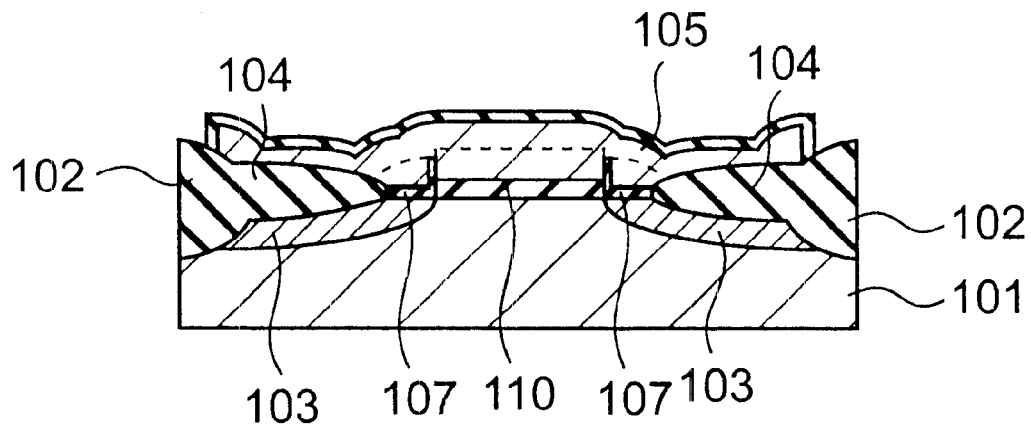
Figure 3J:
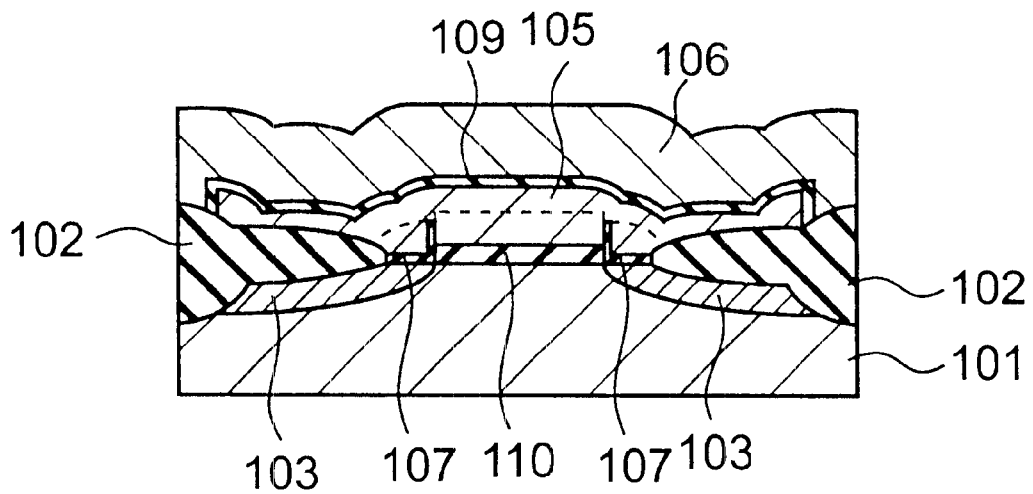

FIG. 2 illustrates a cross sectional view of the non-volatile semiconductor memory device according to the second embodiment of the present invention. Unlike the first embodiment illustrated in FIG. 1I, each memory cell has a source diffusion layer and a drain diffusion layer according to the second embodiment illustrated in FIG. 2. The same numerals thus are used for the same items in both of the first and second embodiments, avoiding redundant explanation. As illustrated in FIG. 2, the source diffusion layer 18 and the drain diffusion layer 19 are formed on both sides of each floating gate 28 in the second embodiment. The second embodiment composed such way can thus obtain the same effect as the first embodiment.

Hereunder, description will be made concretely for results of the measurement and comparison of the capacity ratios and memory cell sizes between manufactured non-volatile semiconductor memories in the above-mentioned embodiments of the present invention.

In this embodiment, when the minimum design size is 0.2 $\mu$m, it is assumed that the projection 24 of the floating gate 28 is 0.2 $\mu$m. And, since the size of the second oxide film 16 is decided by the side wall 17 and the film 16 can be formed with the minimum design size or less, the one side channel length under the second oxide film 16 is assumed to be 0.04 $\mu$m. In addition, it is assumed that the channel length under the gate oxide film 12 is 0.2 $\mu$m, the thickness of the gate oxide film 12 is 160 Å, the thickness of the second oxide film 16 is 80 Å, and the thickness of the interlaminar insulating film 25 is 160 Å. Then, the capacity ratio becomes 0.78.

Since the minimum design size can be used for each of the gate width, the channel length, the source width, the drain width, and the element isolating film width in this embodiment, 0.2 μm can be assumed for each of those sizes. In addition, since two memory cells can share one source diffusion layer 18, the word line-wise cell length and the bit line-wise cell length can be set to 0.6 μm and 0.4 μm respectively for a non-volatile semiconductor memory provided with a common source diffusion layer 18 illustrated in FIG. 1I. Consequently, in the non-volatile semiconductor memory in this embodiment, each memory cell becomes 0.24 μm² in size.

On the other hand, in the non-volatile semiconductor memory disclosed in the Japanese Laid-Open Application Patent No. 7-153857, the floating gate must be 0.55 μm in width to obtain a capacity ratio of 0.78 if the polysilicon layer used to unite the gate polysilicon film 111 and the gate side wall film 117 into one is 2000 Å in thickness. At this time, it is impossible to set the space between floating gates under the minimum design size, the word line-wise cell length becomes 0.75 μm and the bit line-wise cell length becomes 0.4 μm. Consequently, each memory size in the conventional non-volatile semiconductor memory becomes 0.3 μm². It is 1.25 times the memory cell size in this embodiment.

It is also possible in this embodiment to set the memory size smaller than that of the conventional memory cell to obtain a predetermined capacity ratio. In the conventional non-volatile semiconductor memory, however, the capacity ratio is improved by extending the floating gate in parallel to the substrate even when the design rule is small. Consequently, it is impossible to make the memory cell size smaller. The difference between the conventional memory cell size and the memory cell size in this embodiment is thus increased significantly.

As described above in detail, according to the present invention, the area where the control gate and the floating gate face each other in each memory cell is secured largely and the center portion of the insulating film formed between the floating gate and the substrate is thicker than the peripheral portion. Consequently, the capacity ratio between the control gate-floating gate and the floating gate-substrate can be increased. Both writing and erasing performances can thus be speeded up. According to the present invention, such the capacity ratio can also be improved without extending the floating gate onto the source-drain area. It is thus possible to minimize the width of the floating gate, allowing the memory cell size to be reduced. In addition, according to the present invention, the lithographic process is needed only once for forming floating gates, allowing both manufacturing and facility costs to be reduced.

It is apparent from the aforementioned specification and the figures that the present invention is not limited to the above embodiments but may be modified and changed without deparing from the scope and spirit of the invention.

What is claimed is:

1. A semiconductor memory device comprising:
   a semiconductor substrate;
   a first diffusion region and a second diffusion region formed selectively on said semiconductor substrate;
   a first insulating film formed between said first diffusion region and said second diffusion region on said semiconductor substrate;
   a second insulating film formed between said first insulating film and said first diffusion region on said semiconductor substrate;
   a third insulating film formed between said first insulating film and said second diffusion region on said semiconductor substrate, said first insulating film having a thickness which is thicker than the thickness of each of said second and third insulating film; and
   a floating gate film of a non-volatile memory cell, said floating gate being formed on said first insulating film, said gate film have a projection portion protruded from an end portion thereof.

2. The device as claimed in claim 1, wherein said first diffusion region is a source region of a non-volatile memory cell, said second diffusion region is a drain region of said non-volatile memory cell, said first insulating film is a gate isolation film of said non-volatile memory cell, and said gate film is a floating gate of said non-volatile memory cell.

3. The device as claimed in claim 2, wherein the thickness of each of said second and third insulating films is 70 to 110 Å and the thickness of said first insulating film is 120 to 200 Å.

4. The device as claimed in claim 3, wherein said semiconductor substrate has a recess formed at an outer region of an element area including said memory cell, further said device comprising an element isolating film embedding said recess to partition said element area.

5. The semiconductor device as claimed in claim 1, further comprising:
   an element isolating film is formed in said semiconductor substrate adjacent to said second diffusion region and is formed on said second diffusion region.

6. The semiconductor device as claimed in claim 5, further comprising:
   an interlaminar insulating film formed on said gate film.

7. The semiconductor device as claimed in claim 6, wherein said interlaminar insulating film comprises a silicon oxide film and a silicon nitride film.

8. The semiconductor device as claimed in claim 1, wherein said body portion and said first insulating sidewall extend vertically to substantially the same height.

9. The device as claimed in claim 1, wherein said floating gate film has a body portion formed on said insulating film, said body portion having a top surface, and said first projection portion has a top surface, said top surface of said projection portion projects further from said substrate than said top surface of said body portion.

10. A semiconductor memory device, comprising:
    a semiconductor substrate;
    a first diffusion region formed in said semiconductor substrate;
    a second diffusion region formed in said semiconductor substrate, said second diffusion region apart from said first diffusion region;
    a first insulating film formed between said first diffusion region and said second diffusion region on said semiconductor substrate;
    a floating gate film of a non-volatile memory cell, said floating gate being formed on said first insulating film, said floating gate film having a first projection portion on an end portion thereof, said projection portion arranged between said first diffusion region and said second diffusion region, and
    a second insulating film formed between said first diffusion region and said first insulating film on said semiconductor substrate, said projection portion being formed on said second insulating film.

11. The semiconductor device as claimed in claim 10, wherein a thickness of said insulating film is larger than a thickness of said second insulating film.

12. The semiconductor device as claimed in claim 11, wherein said thickness of said insulating layer is 120 to 200 Å and said thickness of said second insulating film is 70 to 110 Å.

13. A semiconductor device comprising:

a semiconductor substrate;

a first diffusion region and a second diffusion region formed selectively on said semiconductor substrate;

a first insulating film formed between said first diffusion region and said second diffusion region on said semiconductor substrate;

a second insulating film formed between said first insulating film and said first diffusion region on said semiconductor substrate;

a third insulating film formed between said first insulating film and said second diffusion region on said semiconductor substrate, said first insulating film having a thickness which is thicker than the thickness of each of said second and third insulating film; and a floating gate film of a non-volatile memory cell, said floating gate comprising, a projection portion protruded from an end portion of said gate film.

14. The device as claimed in claim 13, wherein said floating gate film has a body portion formed on said insulating film, said body portion having a top surface, and said first projection portion has a top surface, said top surface of said projection portion projects further from said substrate than said top surface of said body portion.

15. A semiconductor memory device, comprising:

a semiconductor substrate;

a first diffusion region formed in said semiconductor substrate;

a second diffusion region formed in said semiconductor substrate, said second diffusion region apart from said first diffusion region;

an insulating film formed between said first diffusion region and said second diffusion region on said semiconductor substrate; and a floating gate film of a non-volatile memory cell, said floating gate being formed on said insulating film, said floating gate film having a first projection portion on an end portion thereof, said projection portion arranged between said first diffusion region and said second diffusion region, said floating gate film having a body portion formed on said insulating film, said body portion having a top surface, and said first projection portion has a top surface, said top surface of said projection portion projecting further from said substrate than said top surface of said body portion.

* * * * *